(12) United States Patent
Jaskowiak et al.

(10) Patent No.: US 9,812,208 B2
(45) Date of Patent: Nov. 7, 2017

(54) SYSTEM AND METHOD FOR EMPLOYING SECURE NON-VOLATILE STORAGE DEVICES IN GAMING MACHINES

(71) Applicant: Incredible Technologies, Inc., Vernon Hills, IL (US)

(72) Inventors: Steven John Jaskowiak, Sleepy Hollow, IL (US); Jeffrey W. Siegrist, West Chicago, IL (US)

(73) Assignee: INCREDIBLE TECHNOLOGIES, INC., Vernon Hills, IL (US)

( * ) Notice: Subject to any disclaimer, the term of this patent is extended or adjusted under 35 U.S.C. 154(b) by 11 days.

(21) Appl. No.: 14/321,137

(22) Filed: Jul. 1, 2014

(65) Prior Publication Data
US 2015/0003155 A1    Jan. 1, 2015

Related U.S. Application Data

(60) Provisional application No. 61/841,526, filed on Jul. 1, 2013.

(51) Int. Cl.
*G11C 16/22* (2006.01)

(52) U.S. Cl.
CPC .................................. *G11C 16/22* (2013.01)

(58) Field of Classification Search
CPC ......... G11C 7/24; G11C 8/20; G11C 11/4078; G11C 13/0059; G11C 16/22
See application file for complete search history.

(56) References Cited

U.S. PATENT DOCUMENTS

| | | | |
|---|---|---|---|
| 2002/0169022 A1* | 11/2002 | Canterbury | G06F 12/1433 463/29 |
| 2005/0068313 A1* | 3/2005 | Morimitsu | G06T 15/503 345/419 |
| 2007/0079043 A1* | 4/2007 | Yu | G06F 13/28 710/305 |
| 2009/0191757 A1* | 7/2009 | Tochi | G06K 19/077 439/607.31 |
| 2010/0205434 A1* | 8/2010 | Kurimoto | G06F 21/78 713/168 |
| 2012/0110245 A1* | 5/2012 | Wu | G11C 5/143 711/103 |

* cited by examiner

*Primary Examiner* — Khamdan Alrobaie
(74) *Attorney, Agent, or Firm* — Husch Blackwell LLP; George S. Pavlik

(57) ABSTRACT

A write-protection system and method for use with a gaming machine. The system having a non-volatile data storage device, an interface device and an electrically conductive connector. The storage device having electronic data storage and a write-protection controller providing a write-protected state and a write-permitting state, the electronic data storage being blocked from receiving electronic write commands in the write-protected state and being able to receive write commands in the write-permitting state. The interface device electrically connecting the data storage device to a power supply and control circuitry of the gaming machine. The interface device connected to the electronic data storage through the controller and the connector.

12 Claims, 4 Drawing Sheets

SYSTEM AND METHOD FOR EMPLOYING SECURE NON-VOLATILE STORAGE DEVICES IN GAMING MACHINES

CROSS REFERENCE TO RELATED APPLICATION

This application claims the benefit of U.S. Provisional Patent Application Ser. No. 61/841,526 filed Jul. 1, 2013, the entirety of which is hereby incorporated by reference as if fully set forth herein.

FIELD

The subject invention pertains to employing non-volatile data storage in connection with an electronic gaming machine and more particularly to a system for incorporating write-protection measures in connection with such non-volatile storage.

BACKGROUND

Electronic gaming machines ("EGMs") are generally well known and have been relatively popular, and profitable, for a number of years. Such machines can be configured to provide a variety of casino or entertainment games, including for example, mechanical or electromechanical slot-type matching games, video games or electronic casino games, such as video poker, blackjack, keno, roulette, etc. It is generally known for EGMs to incorporate a programmable processor and memory for electronically storing game programs and data. Such memory can include, for example, primary storage, such as random access memory (RAM) and secondary, non-volatile storage such as flash memory.

It is a general requirement in many regulated environments that all non-volatile memory or storage be either write-protected or that it only be written to at approved times and for approved purposes during use. While some non-volatile storage can incorporate write-protection as part of its construction and/or the specification for a standard storage interface or means, many do not. Accordingly, a means of ensuring appropriate and required write-protection when using such storage devices would expand the selection of storage devices suitable for EGMs, including many which are desirable for reasons of power, speed, reliability, storage space or economics.

Developments in electronic data transmission and storage in recent years has additionally led to the development of serial advanced technology attachment ("SATA") as an interface for connecting the programmable processor to mass storage devices. SATA offers several advantages over older Parallel ATA ("PATA")/IDE interfaces, including, for example, reduced cable size and cost (e.g. seven conductors instead of 40 or 80), native hot swapping, faster data transfer through higher signaling rates (600 Mbytes/s), and more efficient transfer through an (optional) I/O queuing protocol. Such developments have lead to SATA replacing older PATA/IDE bus interfaces in electronic devices.

Additionally, as games played on EGMs have been becoming increasingly more sophisticated in recent years, they generally require more storage space for game programs, graphics, sound, video or other multi-media content. Thus, there is a need for additional secure non-volatile storage devices for use with such machines. Further, as unauthorized changes to the contents of such a device could result in significant risk to a gaming establishment, there is a strong need that such devices be protected. Accordingly, there is a need in the art for a system and method for providing secure non-volatile storage in connection with an electronic gaming machine that can use a SATA interface to protect the storage device from unauthorized commands.

DETAILED DESCRIPTION

Figure 1:
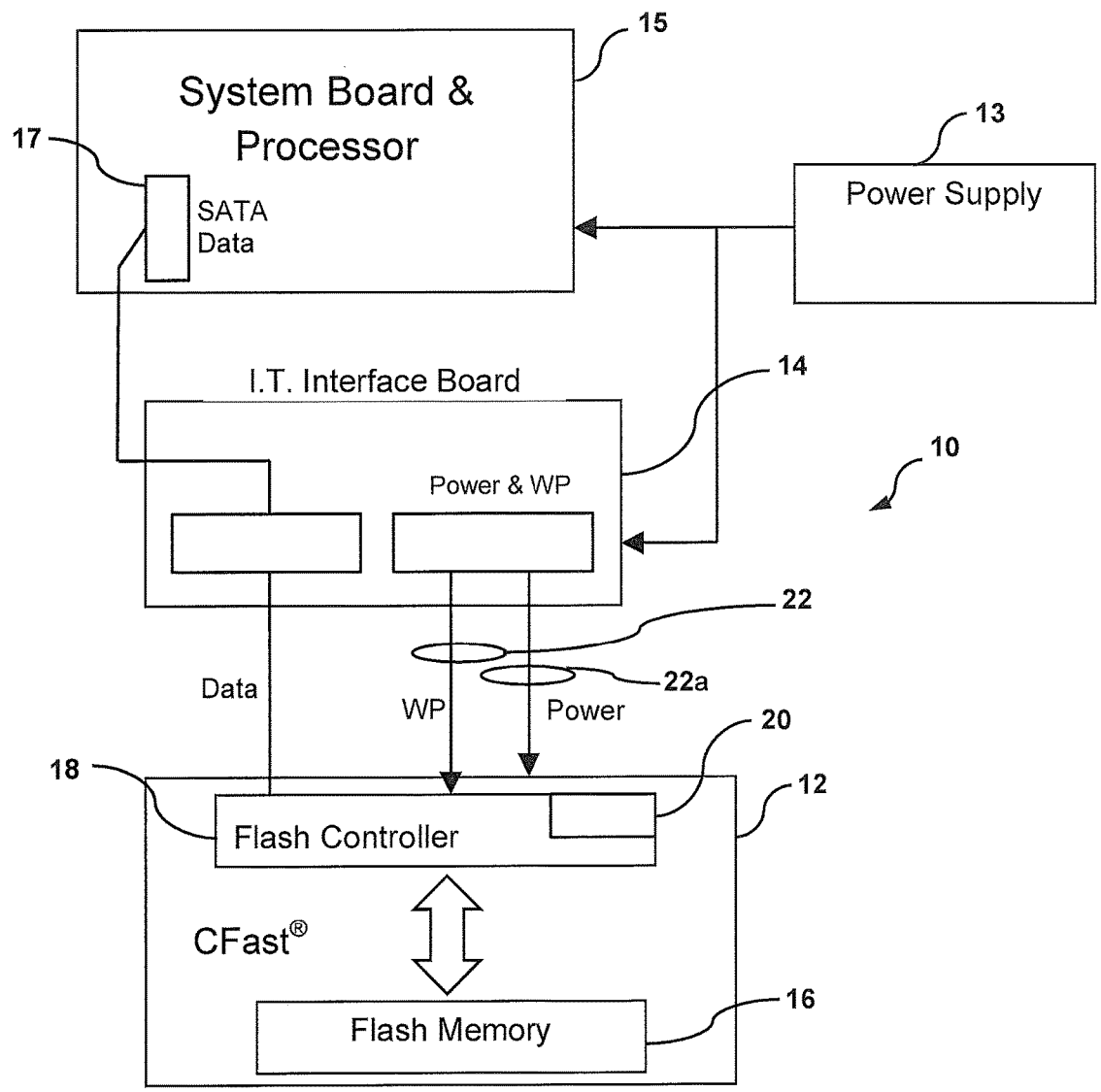
FIG. 1 is a block diagram illustrating a schematic view of a system according to embodiments set forth herein.

While this invention is susceptible of embodiment in many different forms, there are shown in the drawings and will be described herein in detail specific embodiments thereof with the understanding that the present disclosure is to be considered as an exemplification of the principles of the invention and is not intended to limit the invention to the specific embodiments illustrated.

As described herein, embodiments of the subject invention are directed to a system and method of securely employing non-volatile storage devices in gaming and other regulated or secure devices. According to such embodiments, the system can use a type of non-volatile computer memory, such as for example CFast®, which is an industry standard format of non-volatile flash memory that utilizes the SATA bus which can support transfer rates up to 600 MB/sec. Such devices are an improvement over other types of Compact-Flash memory which utilize PATA datastreams which have a limited transfer rate on the order of 167 MB/sec.

As of the time the invention was made, CFast® technology did not incorporate a write-protection bit either in standard hardware or in standard software controller logic. As will be seen from the description which follows, embodiments disclosed herein can allow a configurable or fixed write-protection scheme to be used with CFast® or other types of non-volatile memory without significantly diminishing the desirable features of the device or making significant changes to, or departing from, the CFast® standard which supports a higher maximum transfer rate than other current CompactFlash cards.

With reference now to the figures, FIG. 1 illustrates a representative system 10 according to embodiments presented herein. According to such embodiments, the system can include a modified write-protected non-volatile storage device 12 (hereinafter "WP storage device"), such as for example a modified CFast® flash memory card, and a storage interface device 14 which can be configured to address the write-protection feature of the storage device 12. The WP storage device 12 and interface device 14 can be releasably connected via a plug, port or serial bus having pins, sockets, or male and female connectors. The system 10 can further include a power supply 13 and system board 15 having control circuits, I/O circuits, serial ports or SATA host adaptors 17.

The WP storage device 12 can include a standard commercially available CFast® block non-volatile computer storage medium or flash memory 16 and a custom controller 18 (hereafter the "WP Controller"). It will be recognized that the WP Controller 18 and the non-volatile block memory 16 can both be located within the same kind of physical housing as a standard CFast® storage device and can be physically indistinguishable from a standard CFast® device.

The non-volatile block memory 16 can electronically store computer-readable data, instructions or programs that relate to the operation of the EGM or the execution of games played thereon. The data can be selected, accessed and executed by a central processing unit of the EGM, and in certain instances, the processing unit can write, modify, erase or replace the data stored on the non-volatile block memory 16. The data or programs can be further formatted according to a file system format, which can organize the data into files and directories.

Pursuant to embodiments set forth herein, the WP storage device 12 can be assembled so that the SATA communication interface can be routed entirely through the WP Controller 18. According to such a configuration, it will be recognized that no read or write instruction can reach the block memory 16 without first going through the WP Controller 18.

The WP Controller 18 can include a control element 20 having a processor, control circuitry and/or executable control logic or software stored on a computer readable medium. The control element can be programmed to receive and read an electronic bit set by either a high or low voltage on a pin (the "WP Pin") 22. The WP Pin 22 can be part of the standard SATA hardware interface that is not used by the SATA storage software protocol.

The WP Controller 18 can be programmed to set the bit as either high or low at the time of its manufacturer with such setting being designated as being a "Do Not Accept WRITE commands" status which can instruct the WP Controller 18 to not accept any "WRITE" command sent through the SATA datastream. Alternatively, where the bit is changed to the opposite setting from the one designed as being "Do Not Accept WRITE commands," or is not set at all, the WP Controller 18 can allow "WRITE" commands to be sent to the WP storage device 12 to proceed as called for in the SATA specification. Thus, in operation, the WP Controller 18 can transition between a write-protection state which can block write commands from reaching the non-volatile memory 16 of the storage device 12 and a write-permitting state which can allow such write commands to access the non-volatile memory 16 in order to modify, supplement or erase data stored thereon.

The storage interface device 14 can be configured to accommodate the write-protection function of the WP storage device 12. The interface device 14 can be a separate piece of hardware or a controller integrated into a more general purpose electronic device. According to embodiments presented herein, the interface device 14 can set the "Do Not Accept WRITE Commands" bit to the appropriate value by (1) automatically sending, through hardware, a low or high signal to the WP Pin 22 by virtue of a physical configuration of the interface device 14, or (2) sending, through software, a command to the WP Controller 18 which sets the bit or sets the appropriate high or low signal to the WP Pin 22.

It is generally preferred, but not required, that for purposes of highly regulated equipment (such as, for example, regulating gaming machines), that the WP Pin 22 receive the signal by means of a permanent voltage sent through a non-configurable physical configuration of the interface device 14. In carrying out such a transmission, the WP Pin 22, for example, could always be set to +5V by means of a direct voltage input 22a wired into the cable or connector which can attach the interface device 14 to the WP storage device 12.

When the WP storage device 12 is connected to the interface device 14, and the interface device 14 is itself connected to a general or special purpose computing device which requires write-protected hardware for any desired purpose, the interface device 14 can send a signal to the WP Pin 22 that indicates write protection is to be in effect. The WP Controller 18, recognizing that the WP Pin 22 is set to the "Do Not Accept WRITE Commands" status, can monitor the SATA datastream for WRITE commands and can discard or block such commands, not allowing any WRITE command to affect the contents of the non-volatile block memory 16.

This process can be carried out in concert with software protocols which seek to avoid writing to the non-volatile block memory 16 as per protocol or regulation. This can enable the creator of the software running on the EGM to write more general-purpose software which does not need to be specifically written, checked and certified to include instructions for not sending any WRITE commands to the non-volatile block memory 16. It will be recognized by persons of ordinary skill in the art that such processes can produce a much more efficient and straightforward certification of a complete configuration as non-writable. For example, where the WP storage device 12 and an interface device 14 are used as described herein, it should not matter what the codebase on the general-purpose device is because writing to the non-volatile block memory 16 would be impossible.

Another advantage of the invention is that the WP storage device 12 can be connected to any non-WP storage interface and can immediately become equivalent to a standard CFast® device, allowing data stored thereon to be rewritten as desired. In particular, the WP Controller 18 can require the correct affirmative signal and, absent the signal being present on the WP Pin 22, the WP Controller 18 can simply allow all SATA commands to move through the SATA datastream into the CFast® non-volatile block memory 16. Similarly, since the WP Pin 22 is not used for standard SATA/CFast datastream control, a CFast® device not containing write protection functionality as described herein should still function properly if connected to the interface device 14. This provides for use of the appropriate CFast® or modified CFast® WP storage device 12 at the time of usage. For instance, if a writable CFast® is required to read and store data for transmission or backup, or to enable nonstandard features of the general-purpose device using the WP Controller 18, one can be inserted and removed, and then a CFast®WP storage device 12 can be inserted for ordinary operations.

According to further embodiments, the WP Pin 22 can be sent the appropriate signal by means of a user-configurable hardware change, such as a jumper, a clipable resistor, a DIP switch, or any other reasonable configuration means that would be generally known to one of ordinary skill in the relevant art. According to additional embodiments, the signal could be controlled by an integrated circuit or other similar device controlled by software commands configurable by the user. Regardless, however, it is strongly preferred, but not required, that the hardware and/or software controls for the WP Pin 22 signal be secured in accordance with the general level of security required of the industry or usage in which the WP storage device 12 is to be used.

Figure 2:
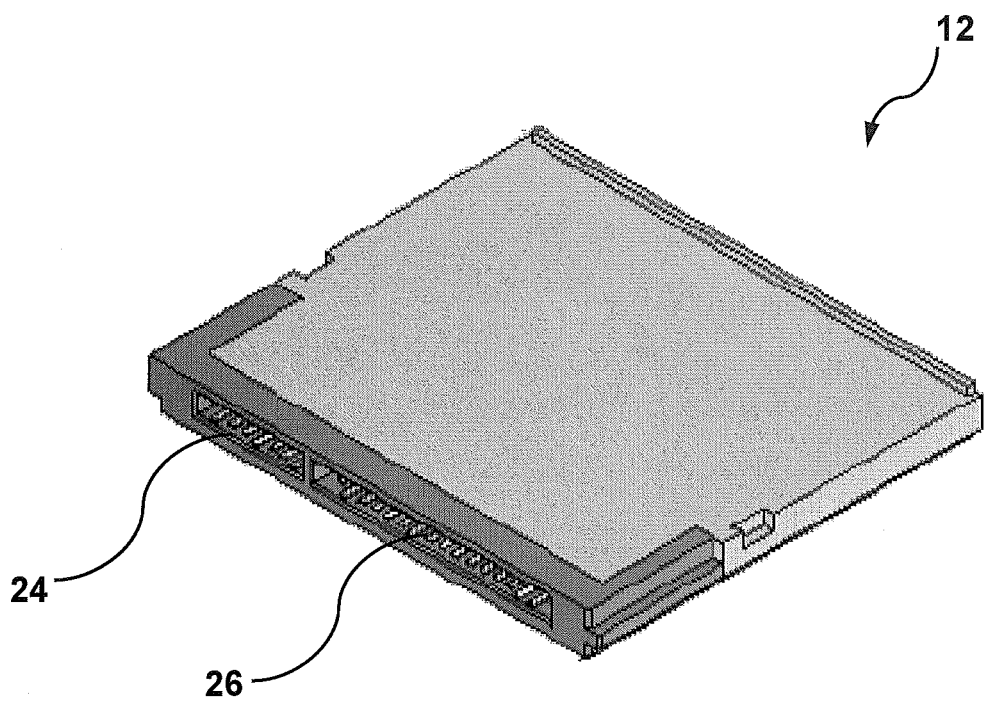
FIG. 2 is a perspective view of a representative data storage unit that can be used in connection with embodiments presented herein.

FIG. 2 illustrates an external view of the housing for a representative WP storage device 12 having a SATA interface. Such device can have dimensions on the order of 42.8 mm×36.4 mm×3.3 mm and can have pinned connector sockets for connecting to the interface device 14, including a seven pin SATA datastream connector 24 and seventeen pin power connector 26.

Figure 3:
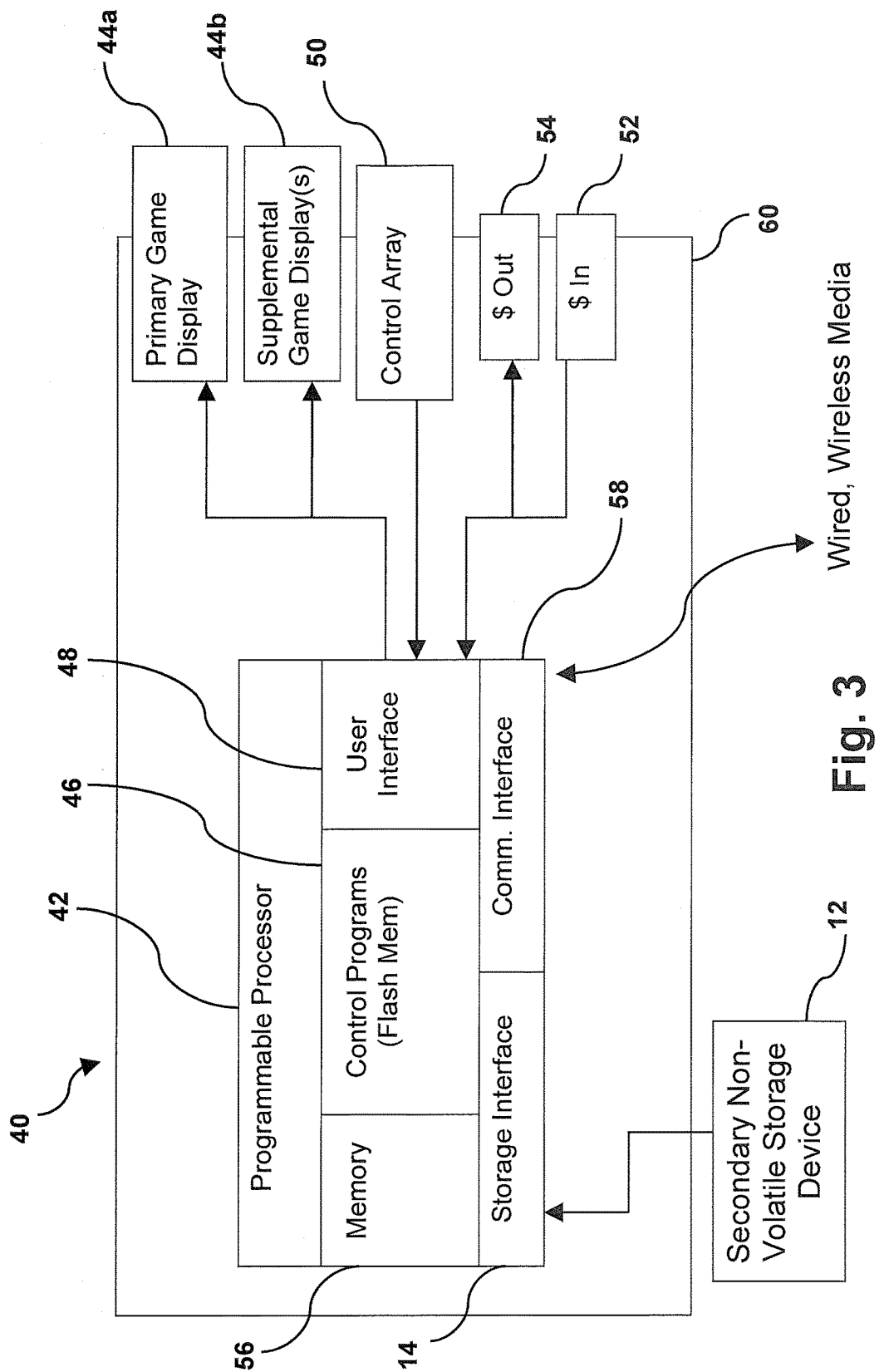
FIG. 3 is a block diagram illustrating a schematic view of an electronic gaming machine that can incorporate the system presented herein.

FIG. 3 is a block diagram illustrating a representative EGM 40 that can incorporate embodiments the subject invention. The EGM 40 can include a programmable processor 42 (such as for example a microprocessor or microcontroller) coupled to one or more game displays 44a, 44b. The processor 42 can include control programs 46 and associated circuitry, a user interface 48 with input/output circuits located within a housing or cabinet 60. The processor 42 can be connected to a primary memory 56, such as for example random access memory (RAM) which can contain dynamic information executed by the processor 42 during operation of the EGM 40 to store fixed information, such as, for example, an operating system, game programs executable by the processor 42. The processor 42 can additionally be connected to the interface device 14 and secondary non-volatile WP storage device 12 as described above via wiring a system board or other circuitry.

The processor 42 can execute the control programs 46 to perform primary functions for play the game, such as for example, randomly selecting game outcomes from a plurality of possible outcomes, recognizing a particular outcome as a predetermined winning or non-winning outcome and/or determining the reward amount for a particular winning outcome. The processor 42 can additionally control the game displays 44a, 44b by generating static or dynamic video for presentation thereon. The video displays 44a, 44b can be any kind of electronic display, including LCD, LED, plasma, CRT or the like. The processor 42 and control programs 46 can additionally include applications for recording and/or registering game data, such as for example, the length of time it takes to play a game, a series of games, or the time interval between successive games or plays.

The control array 50 can be one or more of a keyboard, mechanical lever, a touch-screen, buttons or pads and/or any other means for control, or desired combination of controls, able to accept input from a player and produce output to the game display 44a, 44b in response to a player's input. Where embodiments of the subject invention are practiced or provided in connection with a wagering game, the gaming machine 40 can further include a credit input device 52, such as for example a coin or bill acceptor or card reader and a payoff device 54. The credit input device and payoff device can be operatively connected to the processor 40 and when money or other credits are deposited in connection with a game, the control program 46 can instruct the payoff device to issue an award in response to the selection of certain predetermined winning outcomes of the game. The reward or payoff can be provided in any form, including for example, coins, bills, credits, points, cards, tickets or coupons.

The gaming machine 40 can additionally feature communication means for transmitting game data to a remote computer, network or display device, such as for example a remote server or computer, peripheral storage or display device or other mobile electronic device such as for example a PDA, smart phone, notebook computer or electronic tablet which can store, access and/or display the transmitted data or information. Such communication means can include a communication interface 58 for communicating with such external electronic devices via wired or wireless media.

Figure 4:
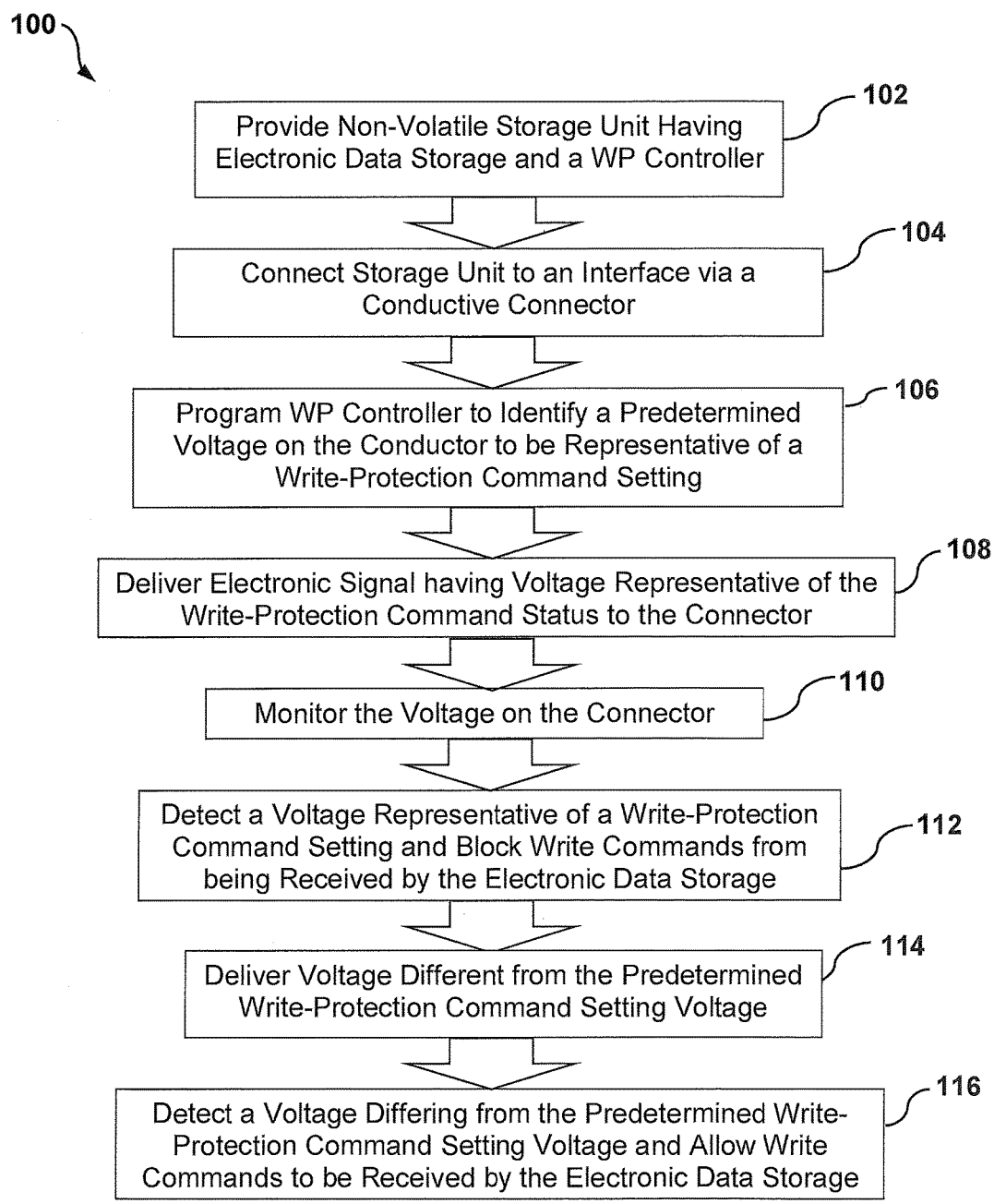
FIG. 4 is a flowchart illustrating a method according to embodiments presented herein.

FIG. 4 is a block diagram illustrating a method 100 according to embodiments presented herein. According to such method 100, a non-volatile storage device can be provided 102 having electronic data storage and WP controller unit as previously described herein. The storage device can be connected 104 to a write-protection interface having a conductive connector such as a WP Pin which can carry an electronic bit or signal at high or low voltage. The WP controller can be programmed 106 to identify a predetermined voltage on the connector representative of being a "Do Not Accept WRITE commands" setting.

A electronic signal having a voltage representative of the predetermined "Do Not Accept WRITE commands" status voltage can be delivered 108 to the WP Pin via the interface. The WP controller can monitor 110 the voltage of the signal on the WP pin and can detect 112 that the voltage as being indicative of the "Do Not Accept WRITE Commands" status and can block WRITE commands transmitted to the storage device via the SATA datastream so that the contents of the non-volatile data storage is not modified.

Where data stored on the non-volatile storage device is to be written or modified, a voltage different from that of the predetermined "Do Not Accept WRITE commands" status voltage can be delivered 114 to the WP Pin. The WP Controller can detect 116 the differing voltage at the WP Pin and allow WRITE commands to be received by the non-volatile electronic data storage.

As will be understood by those of ordinary skill in the art, while the description above details the preferred and best mode(s) of practicing the invention, many other configurations and variations are possible. For example, the invention need not be practiced with a commercial/regulated gaming system, but could be used with a variety of coin-operated amusement devices, home gaming systems, or any other appropriate system. Accordingly, the scope of the invention should be determined not by the embodiment(s) illustrated, but by the claims below and their equivalents.

From the foregoing, it will be observed that numerous variations and modifications may be effected without departing from the spirit and scope of the invention. It is to be understood that no limitation with respect to the specific apparatus illustrated herein is intended or should be inferred. It is, of course, intended to cover by the appended claims all such modifications as fall within the scope of the claims.

Further, logic flows depicted in the figures do not require the particular order shown, or sequential order, to achieve desirable results. Other steps may be provided, or steps may be eliminated, from the described flows, and other components may be added to, or removed from the described embodiments.

What is claimed is:

1. A write-protection system for use with a gaming machine, comprising:
   a releasably connected non-volatile data storage device having an exterior housing, first and a second connector sockets each having a recessed area featuring a plurality of connector pins, and electronic data storage operatively connected to a write-protection controller, the first connector socket on the data storage device being configured to receive a data connector and the second connector socket on the data storage device being configured to receive a power connector separate from the data connector, the controller having a control element, associated circuitry and control logic stored on a non-transitory computer-readable medium for activating a write-protected state and a write-permitting state, in the write-protected state electronic write commands being blocked from being received by the electronic data storage by the controller and in the write-permitting state electronic write commands being able to be received by the electronic data storage, the control element being programmable to receive an electronic two-state bit represented by electrical voltage on a write-protection pin, the write-protection pin being one of the plurality of connector pins, a first state of the electronic bit being a first voltage corresponding to the write-protected state and a second state of the electronic bit being a second voltage corresponding to the write-permitting state;

an interface device electrically connecting the data storage device to a power supply and control circuitry of the gaming machine, the interface device being a controller separate from the releasable storage device and integrated with circuitry of the gaming machine, the electronic data storage device being detachably connected to the interface device through the controller and plurality of connector pins of the first and second connector sockets, the detachable connection being a non-configurable configuration of the interface device where all write commands are entirely routed through the controller on the releasable storage device before reaching the electronic data storage, the voltage of the electronic bit corresponding to the write-protection state being set by the interface device through transmission of a signal to the write-protection pin, the signal being carried by a permanent voltage through the non-configurable interface, and the write-protection pin connecting the controller and the interface device, the write-protection pin carrying a voltage generated by the power supply, wherein voltage generated by the power supply and carried by the write-protection pin is determinative of whether all of the write commands are blocked.

2. The system of claim 1 where the interface is a serial advanced technology attachment interface.

3. The system of claim 1 where the electronic data storage is a flash memory.

4. The system of claim 1 where the controller monitors the data connection for write commands in the write-protected state.

5. An electronic gaming machine comprising:
a programmable processor, control circuitry and instructions stored on a computer readable medium, the instructions being executable by the processor to execute one or more game programs;
a control array having at least one player input device;
a user interface operatively connecting the processor to the control array;
at least one electronic display device operatively connected to the processor, the display device visually presenting a game played on the machine;
a releasably connected non-volatile data storage device having an exterior housing, first and a second connector sockets each having a recessed area featuring a plurality of connector pins, and electronic data storage operatively connected to a write-protection controller, the first connector socket on the data storage device being configured to receive a data connector and the second connector socket on the data storage device being configured to receive a power connector separate from the data connector, the controller having a control element, associated circuitry and control logic stored on a non-transitory computer-readable medium for activating a write-protected state and a write-permitting state, in the write-protected state electronic all write commands being blocked from being received by the electronic data storage by the controller and in the write-permitting state electronic all write commands being able to be received by the electronic data storage, the control element being programmable to receive an electronic two-state bit represented by electrical voltage on a write-protection pin, the write-protection pin being one of the plurality of connector pins, a first state of the electronic bit being a first voltage corresponding to the write-protected state and a second state of the electronic bit being a second voltage corresponding to the write-permitting state;

an interface device electrically connecting the data storage device to a power supply and control circuitry of the gaming machine, the interface device being a controller separate from the releasable storage device and integrated with circuitry of the gaming machine, the electronic data storage device being detachably connected to the interface device through the controller and plurality of connector pins of the first and second connector sockets, the detachable connection being a non-configurable configuration of the interface device where all write commands are entirely routed through the controller on the releasable storage device before reaching the electronic data storage, the voltage of the electronic bit corresponding to the write-protection state being set by the interface device through transmission of a signal to the write-protection pin, the signal being carried by a permanent voltage through the non-configurable interface, and the write-protection pin connecting the controller and the interface device, the write-protection pin carrying a voltage generated by the power supply, wherein voltage generated by the power supply and carried by the write-protection pin is routed entirely through the controller on the releasable storage device and is determinative of whether all of the write commands are blocked.

6. The electronic gaming machine of claim 5 where the interface is a SATA interface.

7. The electronic gaming machine of claim 5 where the electronic data storage comprises a flash memory.

8. The electronic gaming machine of claim 5 where the data storage device comprises a secondary data storage device and the gaming machine has a primary electronic data storage.

9. A method comprising:
providing a releasably connected non-volatile storage device electrically connected to an interface via a connector, the storage device having an exterior housing, first and second connector sockets each having a recessed area featuring a plurality of connector pins and electronic data storage operatively connected to a write-protection controller the first connector socket on the data storage device being configured to receive a data connector and the second connector socket on the data storage device being configured to receive a power connector separate from the data connector;
programming the controller to identify an electronic two-state bit represented by electrical voltage on a write-protection pin as being associated with a write protection command setting, the write-protection command setting being a first state of the two-state electronic bit represented by a first voltage;
connecting the non-volatile storage device to the interface via the connector, the connecting establishing a non-configurable configuration of the interface device where all write commands are entirely routed through the controller on the releasable storage device before reaching the electronic data storage, delivering a voltage representative of the write protection command setting to the controller through the interface and connector, the interface being integrated with circuitry from an electronic gaming machine and separate from the releasable storage device, the voltage of the corresponding to the write-protection command setting being set by an interface device through transmission of a signal to a write-protection pin, the signal being carried by a permanent voltage through the non-configurable communication interface;

monitoring the voltage on the connector at the write protection controller;

detecting the predetermined voltage at the controller, and in response thereto, blocking all write commands from being received by the electronic data storage, detecting a voltage differing from predetermined voltage at the controller, and in response thereto, allowing all write commands to be sent through the controller on the releasable storage device to the electronic data storage, and wherein all the predetermined voltage and voltage differing is carried by the connector.

10. The method of claim 9 further comprising transmitting electronic write commands to the storage device via a SATA datastream.

11. The method of claim 9 further comprising supplying an electronic signal to the connector having a voltage different from the predetermined voltage.

12. The method of claim 9 further comprising sending a command to the controller to set a signal having a selected voltage on the connector.

* * * * *